(12) United States Patent
Kerley

(10) Patent No.: US 6,225,874 B1
(45) Date of Patent: *May 1, 2001

(54) COUPLING STRUCTURE AS A SIGNAL SWITCH

(75) Inventor: John C. Kerley, Elbert, CO (US)

(73) Assignee: Agilent Technologies Inc., Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/087,293

(22) Filed: May 29, 1998

(51) Int. Cl.⁷ .................... H01P 1/15; H01P 5/18
(52) U.S. Cl. .............. 333/104; 333/109; 333/112; 333/116
(58) Field of Search ............. 333/101, 103, 333/104, 109, 112, 116, 117, 118, 120

(56) References Cited

U.S. PATENT DOCUMENTS

| 3,659,227 | * | 4/1972 | Whistler | 333/103 |
| 4,078,214 | * | 3/1978 | Beno | 333/103 |
| 4,129,838 | * | 12/1978 | Wallington et al. | 333/262 X |
| 4,701,724 | * | 10/1987 | Martin | 333/104 X |
| 5,109,205 | | 4/1992 | Hart et al. | 333/104 |
| 5,233,318 | * | 8/1993 | Sasaki et al. | 333/109 |

FOREIGN PATENT DOCUMENTS

| 0710997A1 | 10/1995 | (EP) | H01P/1/15 |
| 1201320 | 11/1967 | (GB) | H01P/1/10 |
| 233901 | * | 11/1985 | (JP) | 333/262 |

* cited by examiner

Primary Examiner—Benny Lee
(74) Attorney, Agent, or Firm—Alexander J. Neudeck

(57) ABSTRACT

An AC signal is switched between two circuit branches using a transformer or at least one directional coupler as a coupling device. Electronically controlled switches shunt one of two terminals of the coupling device to AC ground. The input signal is propagated out of the non-shunted terminal to one of the two circuit branches. The electronically controlled switches may be relays, transistors, or diodes. Diodes prevent the AC signal from being shunted to AC ground when reverse biased and shunt the AC signal to AC ground when forward biased.

21 Claims, 4 Drawing Sheets

COUPLING STRUCTURE AS A SIGNAL SWITCH

FIELD OF THE INVENTION

This invention relates generally to devices that steer electromagnetic signals. Even more particularly, this invention relates to an electronically operated device that switches radio frequency electronic signals between two or more circuit branches.

BACKGROUND OF THE INVENTION

Radio frequency (RF) and microwave signal generators use a high power amplifier to generate large output signals. Unfortunately, non-ideal characteristics of these amplifiers can cause harmonic distortion of the output signal. Harmonic distortion is nonlinear distortion on the output of an amplifier characterized by the appearance in the output of harmonics other that the fundamental component when the input wave is sinusoidal. In a high-quality signal generator, these harmonics must be filtered before the signal leaves the source. The filter should reject signals an octave and greater above the fundamental output frequency. Since the frequency range of the output signal may be a decade or more, multiple sub-octave filter ranges are used. To enable the signal generator to sweep the output signal through a large range of output frequencies very quickly, or to allow computer control of the instrument, it is desirable that the switching between the multiple sub-octave filters be electronically controlled.

A p-i-n diode may be used as electronically controlled switch. (A p-i-n diode is constructed so that an intrinsic layer, the "i region," is sandwiched between a positively doped layer ("p layer") and a negatively doped layer ("n layer"). When reversed biased, a p-i-n diode behaves like an "open" switch. When forward biased, a p-i-n diode behaves like a "closed" switch.

An appropriate arrangement of p-i-n diodes is currently used to route the output signal through the appropriate sub-octave filter and then back to an output node. At the input node, multiple series p-i-n diodes are arranged in a star configuration with one common driven node and multiple intermediate nodes. A shunt diode is placed at each intermediate node. Each intermediate node is then connected to the input of one of the sub-octave filters. The reverse of this arrangement is used to route the outputs of the sub-octave filters back to a common output node. The path through the desired filter is used by forward biasing the series diodes in that path and reverse biasing the shunt diodes connected to that path. The series diodes on the unused paths are reversed biased and the shunt diodes connected to the unused paths are forward biased. The forward biased shunt diodes provide a path to AC ground, effectively stopping any AC signal from propagating down the path the diode is shunting. This isolates the unused paths.

This method of routing signals requires very compact assembly for frequencies above 20 GHz. This is difficult and expensive. Beam lead diodes are more expensive than other types of diode packaging. These diodes should be bonded directly to the shunt diodes. In a very compact assembly, this is a manual operation that increases cost. A series diode is also required to have low capacitance to achieve high isolation when shut off. Because relatively high series resistance is typically associated with low capacitance, the series diodes tend to contribute significant signal loss. Finally, due to their nonlinear characteristics, the series diodes introduce nonlinear distortion that degrades the quality of the output signal.

Accordingly, there is a need in the art for an improved way of electronically switching RF and microwave signals. It is desirable that such a system eliminate series diodes in the signal path since these devices are expensive, hard to assemble, reduce output power, and degrade the quality of the output of the device. Finally, the system should be easy to assemble.

SUMMARY OF THE INVENTION

In a preferred embodiment, the invention provides a switch for AC signals that does not have any diodes in series with the signal path. This improves the quality and power of the signal output after the AC switch and reduces the cost of the AC switch. The AC switch may be manufactured using traditional techniques that may be automated.

An embodiment of a single-pole double-throw AC switch according to the invention includes a four terminal coupling device or structure, such as a transformer, 3dB, or other directional coupler. The input signal is fed to one terminal of the coupling device. The input corresponds to the pole of the AC switch. A second terminal of the coupling device is connected to an AC ground. The third and fourth terminals connect to the outputs, or throws, of the AC switch. The third and fourth terminals are also each connected to one of two shunt switching devices that, when on, shunt the third or fourth terminal of the coupling device, respectively, to AC ground. Only one of these two shunts is turned on at a time. This results in the input signal being coupled to the terminal with the shunt that is not on without the signal passing through a series diode.

Another embodiment of a single-pole double-throw AC switch for switching selected frequencies of RF and microwave signals includes a directional coupler with a nominal coupling factor of 3 dB as the coupling device. P-i-n diodes are used as the shunting devices. When forward biased, the p-i-n diodes shunt the terminal to which they are connected to AC ground.

Another embodiment of a single-pole double-throw AC switch for switching selected frequencies of RF and microwave signals includes two cascaded directional couplers. Each of these couplers has a nominal coupling factor of 8.34 dB for a nominal net coupling factor of 3 dB for the entire structure. P-i-n diodes are used as the shunting devices. By cascading two directional couplers, the shunt diodes may be located farther from each other and one of the output terminals may be located closer to the input terminal. This structure also improves manufacturability by allowing greater line width and spacing to be used. Greater line widths and spacing also decreases signal loss inside the structure.

Other embodiments include multi-layer coupling structures, waveguide coupling structures, stripline coupling structures, or any other type of RF or microwave coupling structure as the coupling device. One example of a multi-layer coupling structure is a multi-layered broadside coupled structure. Other embodiments include a greater number of throws for the switch. For example, the first embodiment, above, can be made into a single-pole triple-throw switch by removing the AC ground connection from the second terminal of the four terminal coupling device and making that terminal the third the output, or throw, of the AC switch. A third shunt device would also be connected between the second terminal and an AC ground.

DETAILED DESCRIPTION OF THE PREFERRED EMBODIMENTS

Figure 1:
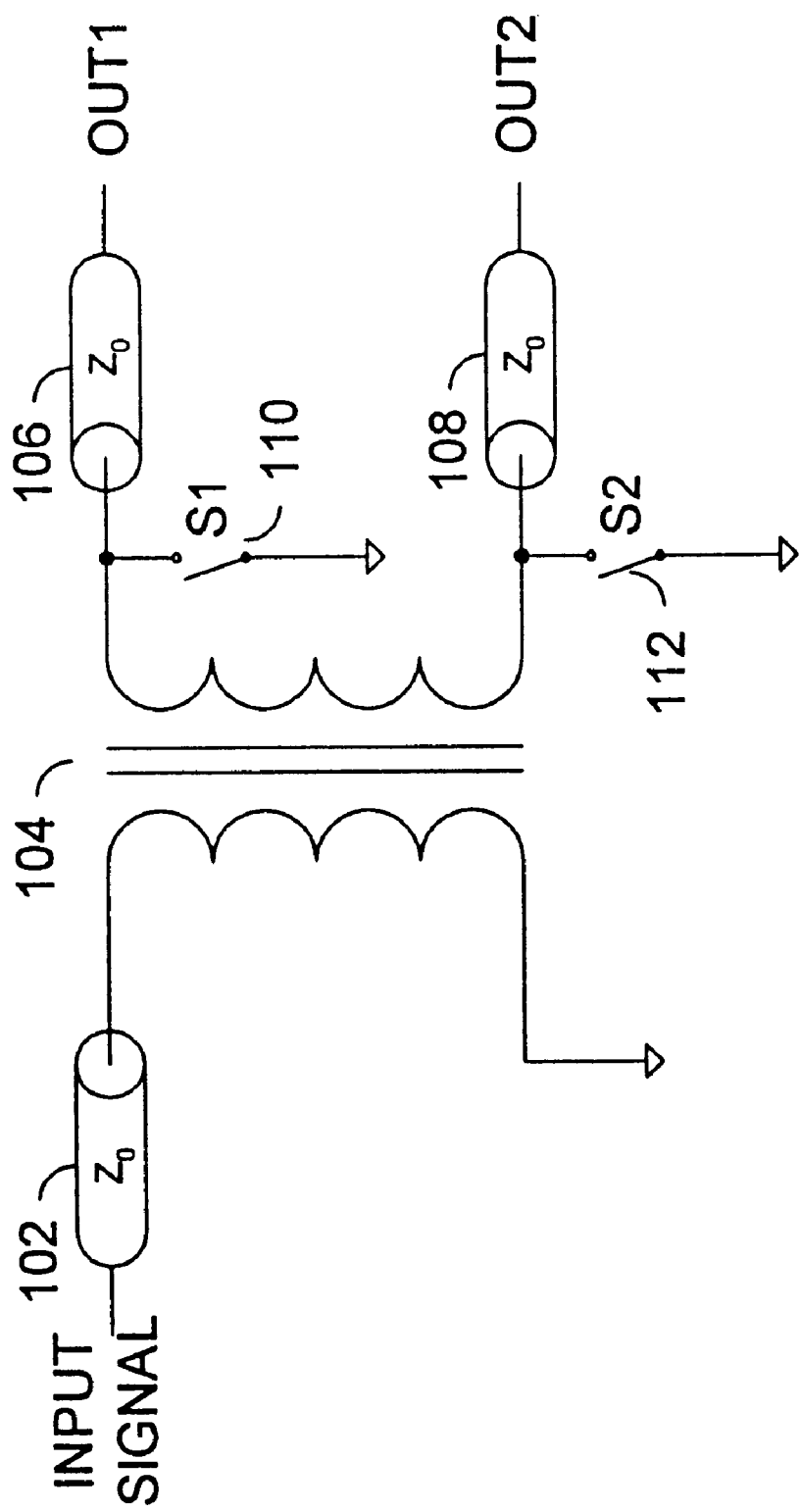
FIG. 1 illustrates a single-pole double-throw AC switch according to the present invention using a transformer as the coupling device.

FIG. 1 illustrates a single-pole double-throw AC switch that uses a transformer as the coupling device. The input signal enters the AC switch via transmission line 102 and exits via transmission line 106 to node OUT1 or transmission line 108 to node OUT2. $Z_0$ represents the impedance values of the respective transmission lines 102, 106, and 108. Transmission line 102 connects to coupling device 104 which is a transformer in FIG. 1. Transmission line 102 feeds one terminal of the primary inputs. The other primary terminal of the coupling device is connected to ground. This may be either an AC or DC ground as long as it acts like an AC ground over the desired operating frequencies.

With a transformer, the primary inputs correspond to the terminals of the primary winding of the transformer and the secondary corresponds to the terminals of the secondary winding. A first terminal of the secondary of coupling device 104 is connected to transmission line 106. The second terminal of the secondary of coupling device 104 is connected to transmission line 108. Also connected to the first terminal of the secondary of coupling device 104 is a switch, S1 110. Also connected to the second terminal of the secondary of coupling device 104 is a switch, S2 112. S1 and S2, when on, shunt AC signals in the desired operating frequencies to an AC ground. Switches S1 and S2 can be diodes, bipolar transistors, relays, field-effect transistors, or any other kind of switching device or structure that will shunt AC signals in the desired operating frequencies to an AC ground.

When an input signal is applied to the AC switch via transmission line 102, that input signal is coupled, at least in part, to the secondary. If switch S2 112 is on and switch S1 110 is off, then no signal can propagate down transmission line 108 because its input is held at AC ground and all of the coupled signal propagates down transmission line 106 to OUT1. If switch S2 112 is off and switch S1 110 is on, then no signal can propagate down transmission line 106 because its input is held at AC ground and all of the coupled signal propagates down transmission line 108 to OUT2. Accordingly, by turning switches S1 and S2 appropriately, the input signal may be routed to OUT1 or OUT2 without having the signal pass through a diode or other switching device.

Figure 2:
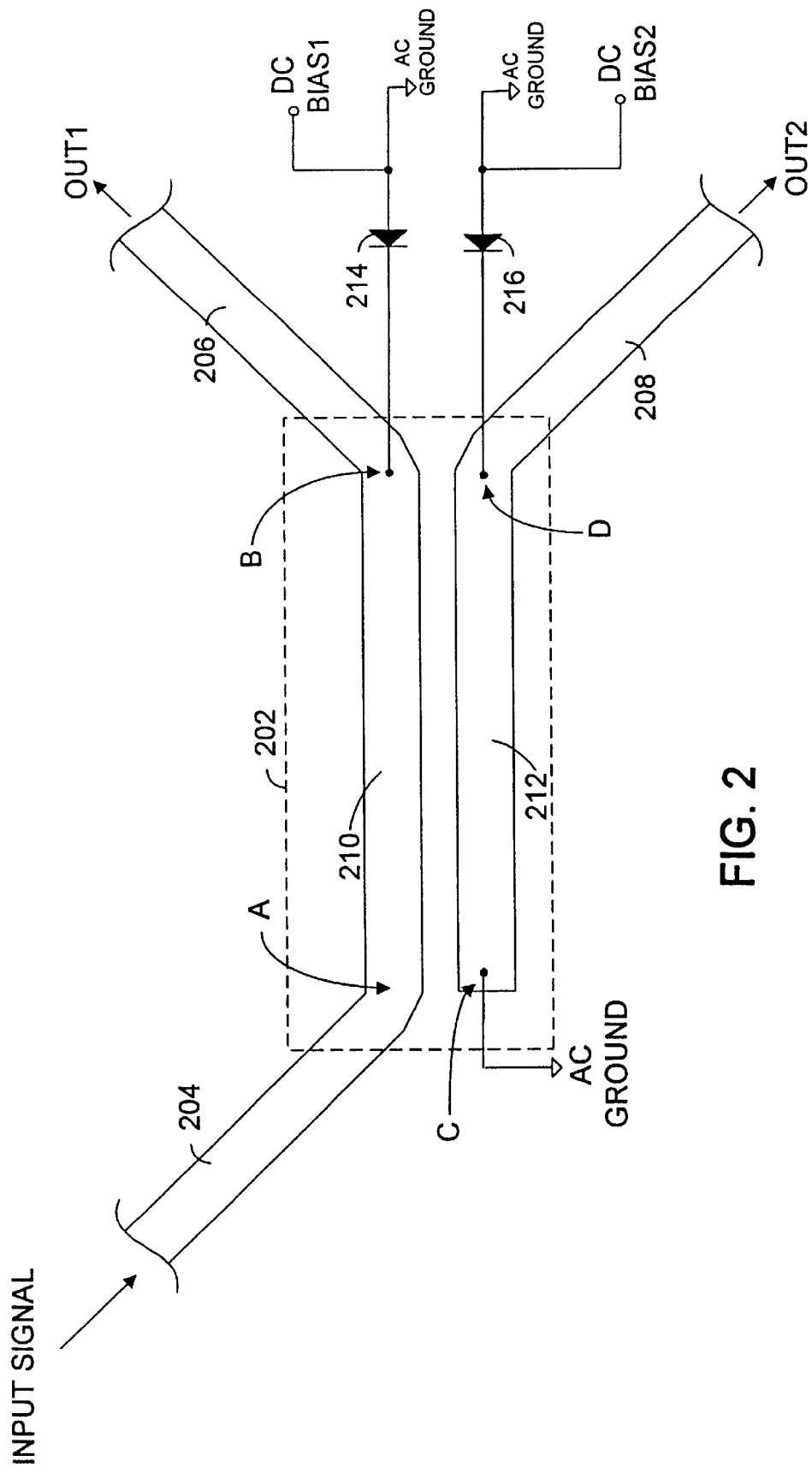
FIG. 2 illustrates a microstrip implementation of a frequency selective singlepole double-throw AC switch using diodes as the shunt devices.

FIG. 2 illustrates a microstrip implementation of a frequency dependent single-pole double-throw AC switch using diodes as the shunt devices. The coupling device is shown generally inside box 202. The coupling device is comprised of two parallel microstrip lines 210, 212 that are close together. The spacing of the lines is chosen to set certain desired characteristics of the coupling device including the coupling factor, even mode impedance ($Z_{oe}$), and odd mode impedance ($Z_{oo}$). In an embodiment, this coupling device nominally has a coupling factor of 3 dB. The length of microstrip lines (as shown in FIG. 2 as the distance from point A to point B for microstrip line 210 and the distance from point C to point D for microstrip line 212) is chosen to be a quarter wavelength of the frequency of maximum desired coupling. The input signal is fed to the coupling device 202 via transmission line 204. This connects to one end of microstrip line 210 (at point A). The other end of microstrip line 210 (point B) is connected to transmission line 206. Transmission line 206 connects to one output of the switch, node OUT1.

The signal on microstrip line 210 is coupled to microstrip line 212. The end of microstrip line 212 (point C) that is next to the input of coupling device 202 (point A) is connected to AC ground. The other end of microstrip 212 (point D) is connected to transmission line 208. Transmission line 208 connects to the other output of the switch, node OUT2. The cathode of p-i-n diode 214 is connected to the output of coupling device 202 at point B. The anode of p-i-n diode 214 is connected to AC ground and a first DC bias voltage (DC BIAS1). The cathode of p-i-n diode 216 is connected to the other output of coupling device 202 at point D. The anode of p-i-n diode 216 is connected to AC ground and a second DC bias voltage (DC BIAS2). By controlling the first and second DC bias voltages, p-i-n diodes 214 and 216 may be forward and reversed biased. When forward biased, diodes 214 and 216 provide a shunt to AC ground at points B and D, respectively. When reversed biased, diodes 214 and 216 act like an open switch to AC ground.

Figure 4:
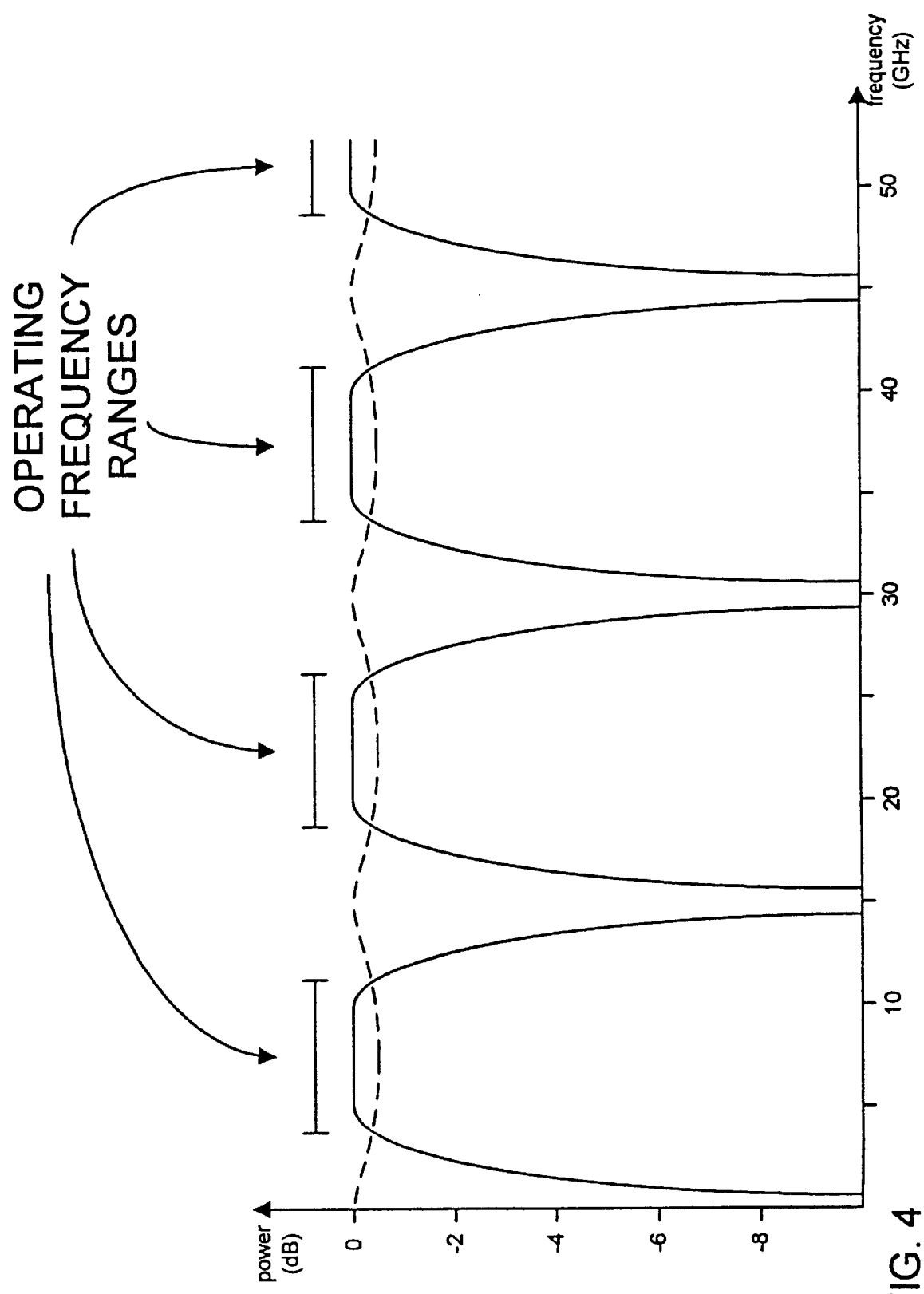
FIG. 4 is a representational plot of signal power transmitted through a microstrip frequency selective single-pole double-throw switch.

FIG. 4 illustrates the frequency dependent nature of the switch shown in FIG. 2. FIG. 4 is a plot of output power relative to input power versus frequency for the two operating modes of the switch. The solid line shows the signal output power at node OUT2 when point B is shorted to AC ground. The dashed line shows the signal output power at node OUT1 when point D is shorted to AC ground. The plot is relative to the input signal power level so a 0 dB level on the plot means all of the input power is transmitted to the output port.

As shown in FIG. 4, the power transmitted to node OUT2 has periodic "nulls" where little or no power is transmitted to node OUT2 over certain frequencies. This is what gives this switch a frequency selective characteristic. Careful application of the switch, however, prevents the frequency selectivity from being a problem. For example, if the switch is used in the signal generator described above, the OUT2 nodes of multiple switches can be used to pass the input signal to the multiple sub-octave filters. The cutoff frequency of each sub-octave filter is then placed in or near a flatband portion (i.e. one of frequency ranges labeled "operating frequency ranges" on FIG. 4) of the response of the switch feeding that sub-octave filter. This eliminates any problem with the "null" portion of the switches frequency response because the sub-octave filter would have removed any frequencies in the "null" portion of the switches frequency response if the frequency response of the switch had not already done so.

Figure 3:
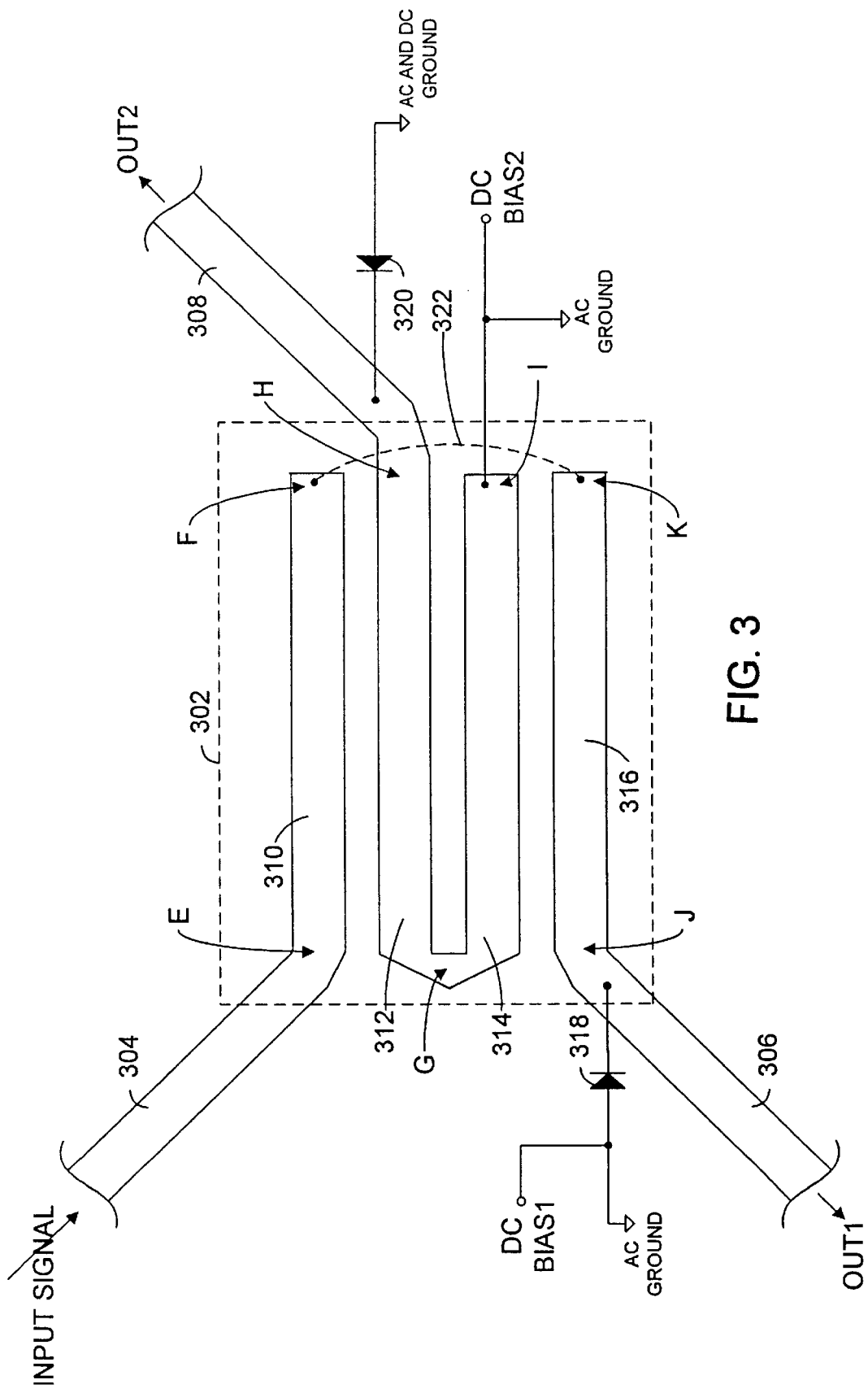
FIG. 3 illustrates a microstrip implementation of a frequency selective singlepole double-throw AC switch that uses cascaded directional couplers.

FIG. 3 illustrates a microstrip implementation of a frequency selective single-pole double-throw AC switch that uses cascaded directional couplers. Each of the cascaded couplers has a coupling factor that is nominally 8.34 dB which makes the coupling factor for the entire structure nominally 3 dB. The coupling device is shown generally inside box 302. The coupling device is comprised of four parallel microstrip lines 310, 312, 314, 316 that are close together. The first directional coupler is comprised of microstrip lines 310 and 312. The second directional coupler is comprised of microstrip lines 314 and 316. They are connected back to back via jumper 322 and a short area of metal at point G.

The spacing of the lines is chosen to set certain desired characteristics of the coupling device including the coupling factor, $Z_{oe}$, and $Z_{oo}$. The length of microstrip lines (as shown in FIG. 3 as the distance from point E to point F for microstrip line 310, the distance from point G to point H for microstrip line 312, the distance from point G to point I for microstrip line 314, and the distance from point J to point K on microstrip line 316) is chosen to be a quarter wavelength of the frequency of maximum desired coupling. The input signal is fed to the coupling device 302 via transmission line 304. This connects to one end of microstrip line 310 (at point E). The other end of microstrip line 310 (point F) is connected to microstrip line 316 (at point K) via a jumper 322. Transmission line 306 connects to one output of the switch, node OUT1, at the other end of microstrip line 316 (point J).

The signal on microstrip line 310 is coupled to microstrip line 312. The end of microstrip line 312 (point G) that is next to the input of coupling device 302 (point E) is connected to the end of microstrip line 314 that is near the output of the second directional coupler (point J). The other end of microstrip 312 (point H) is connected to transmission line 308. Transmission line 308 connects to the other output of the switch, node OUT2. The cathode of p-i-n diode 318 is connected to the output of coupling device 302 at point J. The anode of p-i-n diode 318 is connected to AC ground and a first DC bias voltage(DC BIAS1). The cathode of p-i-n diode 320 is connected to the other output of coupling device 302 at point H. The anode of p-i-n diode 320 is connected to AC ground and a second DC bias voltage(DC BIAS2). By controlling the first and second DC bias voltages, p-i-n diodes 318 and 320 may be forward and reversed biased. When forward biased, diodes 318 and 320 provide a shunt to AC ground at points J and H, respectively. When reversed biased, diodes 318 and 320 act like an open switch to AC ground.

From the foregoing it will be appreciated that the AC switch provided by the invention offers numerous advantages. Such a switch does not have distortion producing and power robbing series diodes or other active devices in series with any of the signal paths. The switch is geometrically simple, and easy to assemble.

Although several specific embodiments of the invention have been described and illustrated, the invention is not to be limited to the specific forms or arrangements of parts so described and illustrated. The invention is only limited by the claims.

What is claimed is:

1. A signal switch, comprising:
    a coupling device, said coupling device having a first terminal, a second terminal, a third terminal, and a fourth terminal wherein an input signal is applied to said first terminal;
    a first switch, said first switch being connected between said third terminal and an AC ground;
    a second switch, said second switch being connected between said fourth terminal and said AC ground; and
    wherein said input signal is only propagated out said third terminal when said first switch is turned off and said second switch is turned on, and wherein said input signal is only propagated out said fourth terminal when said first switch is turned on and said second switch is turned off.

2. The signal switch of claim 1, wherein said second terminal is connected to said AC ground.

3. The signal switch of claim 1, wherein said first switch is comprised of a first p-i-n diode.

4. The signal switch of claim 3, wherein said second switch is comprised of a second p-i-n diode.

5. The signal switch of claim 4, wherein said first switch is turned on by forward biasing said first p-i-n diode and said first switch is turned off by reverse biasing said first p-i-n diode.

6. The signal switch of claim 5, wherein said second switch is turned on by forward biasing said second p-i-n diode and said second switch is turned off by reverse biasing said second p-i-n diode.

7. The signal switch of claim 6, wherein said coupling device is a transformer.

8. The signal switch of claim 6, wherein said coupling device is at least one directional coupler.

9. The signal switch of claim 6, wherein said coupling device has a coupling factor that is nominally 3 dB.

10. The signal switch of claim 1, wherein said coupling device is a transformer.

11. The signal switch of claim 1, wherein said coupling device is a directional coupler.

12. The signal switch of claim 1, wherein said coupling device has a coupling factor that is nominally 3 dB.

13. A method of switching an input signal between a first circuit branch and a second circuit branch, comprising:
    applying said input signal to an input terminal of a coupling device;
    shunting to AC ground a first terminal output of said coupling device and substantially simultaneously connecting a second terminal output of said coupling device to said second circuit branch, and wherein said shunting prevents said input signal from propagating down said first circuit branch and allows said input signal to propagate down said second circuit branch to said second terminal output which is unshunted; and
    alternatively shunting to AC ground said second terminal output of said coupling device and substantially simultaneously connecting said first terminal output of said coupling device to said first circuit branch, and wherein said shunting prevents said input signal from propagating down said second circuit branch and allows said input signal to propagate down said first circuit branch to said first terminal output which is unshunted.

14. The method of claim 13, wherein said step of shunting to AC ground a first terminal output comprises coupling a first switch to said first terminal output so that said first terminal output is shunted to AC ground when said first switch is turned on, and wherein said step of shunting to AC ground a second terminal output comprises coupling a second switch to said second terminal output so that said second terminal output is shunted to AC ground when said second switch is turned on.

15. The method of claim 14, further comprising the steps of:
    implementing said first switch as a first p-i-n diode wherein said first switch is turned on by forwarding biasing said first p-i-n diode; and
    implementing said second switch as a second p-i-n diode wherein said second switch is turned on by forwarding biasing said second p-i-n diode.

16. The method of claim 15, further comprising the step of implementing a transformer as said coupling device.

17. The method of claim 15, further comprising the step of implementing at least one directional coupler as said coupling device.

18. The method of claim 15, further comprising the step of implementing said coupling device to have a coupling factor that is nominally 3 dB.

19. The method of claim 13, further comprising the step of implementing a transformer as said coupling device.

20. The method of claim 13, further comprising the step of implementing at least one directional coupler as said coupling device.

21. The method of claim 13, further comprising the step of implementing said coupling device to have a coupling factor that is nominally 3 dB.

* * * * *